(12) United States Patent
Hiromatsu et al.

(10) Patent No.: US 10,712,652 B2
(45) Date of Patent: Jul. 14, 2020

(54) MASK BLANK HAVING A RESIST LAYER, METHOD FOR MANUFACTURING MASK BLANK HAVING RESIST LAYER, AND METHOD FOR MANUFACTURING TRANSFER MASK (71) Applicant: HOYA CORPORATION, Tokyo (JP)

(72) Inventors: Takahiro Hiromatsu, Tokyo (JP); Hiroaki Shishido, Tokyo (JP); Seishi Shibayama, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 294 days.

(21) Appl. No.: 15/776,862

(22) PCT Filed: Nov. 7, 2016

(86) PCT No.: PCT/JP2016/082927
§ 371 (c)(1),
(2) Date: May 17, 2018

(87) PCT Pub. No.: WO2017/086196
PCT Pub. Date: May 26, 2017

(65) Prior Publication Data
US 2018/0335693 A1    Nov. 22, 2018

(30) Foreign Application Priority Data
Nov. 18, 2015    (JP) ................. 2015-225952

(51) Int. Cl.
G03F 1/40    (2012.01)
G03F 1/38    (2012.01)
G03F 1/78    (2012.01)
G03F 1/26    (2012.01)

(52) U.S. Cl.
CPC ................. *G03F 1/40* (2013.01); *G03F 1/38* (2013.01); *G03F 1/78* (2013.01); *G03F 1/26* (2013.01)

(58) Field of Classification Search
CPC ..... G03F 1/26; G03F 1/38; G03F 1/40; G03F 1/78
USPC ............................................... 430/5
See application file for complete search history.

(56) References Cited

U.S. PATENT DOCUMENTS

| 2001/0018454 A1 | 8/2001 | Wetzel |
| 2015/0140492 A1 | 5/2015 | Sawai et al. |

FOREIGN PATENT DOCUMENTS

| EP | 0 449 439 A1 | 10/1991 |
| JP | 63-288017 A | 11/1988 |
| JP | 02-252231 A | 10/1990 |
| JP | 03-261953 A | 11/1991 |
| JP | 07-152140 A | 6/1995 |
| JP | 2000-098582 A | 4/2000 |
| JP | 2003-107674 A | 4/2003 |
| JP | 2014-009342 A | 1/2014 |

OTHER PUBLICATIONS

International Search Report for PCT/JP2016/082927, dated Jan. 17, 2017.

*Primary Examiner* — Christopher G Young
(74) *Attorney, Agent, or Firm* — Kilpatrick Townsend & Stockton LLP (57) ABSTRACT A mask blank having a resist layer, which enables charge-up to be suppressed during electron beam irradiation. The mask blank having a resist layer includes a substrate having a thin film, a resist layer formed on a surface of the thin film, and a conductive layer formed on the resist layer. The conductive layer includes a first metal layer containing aluminum as a main component thereof and a second metal layer made of a metal other than aluminum. The first metal layer is formed on the resist layer side of the second metal layer.

9 Claims, 2 Drawing Sheets

MASK BLANK HAVING A RESIST LAYER, METHOD FOR MANUFACTURING MASK BLANK HAVING RESIST LAYER, AND METHOD FOR MANUFACTURING TRANSFER MASK

This application is a National Stage of International Application No. PCT/JP2016/082927 filed Nov. 7, 2016, claiming priority based on Japanese Patent Application No. 2015-225952 filed Nov. 18, 2015.

TECHNICAL FIELD

This invention relates to a mask blank having a resist layer, a method of manufacturing a mask blank having a resist layer, and a method of manufacturing a transfer mask.

BACKGROUND ART

A photomask processing step is performed by the following method. A resist layer is formed on a photomask blank in which an optical film (hereinafter also called "thin film") including a light shielding layer and a phase shift film is formed on a substrate, and a resist pattern is formed on the resist layer by irradiating the resist layer with electron beams. Further, the resist pattern is transferred to the above-mentioned light shielding layer and phase shift film by subjecting the shielding layer and the phase shift film to etching.

The resist pattern, which is formed by electron beam irradiation during the processing step, is required to be formed at an extremely accurate position. However, a generally used resist layer is an insulator, and hence accumulation of charges (charge-up) may occur in the resist layer. Then, the charge-up causes distortion of the electron beam radiated to the surface of the photomask blank. The distortion of the electron beam results in slight shift of a position of the resist pattern formed on the photomask, and hence the distortion becomes a cause of reduction in positional accuracy of the resist pattern.

In order to avoid this problem, there has been known a technology of forming an organic conductive layer on the surface of the resist layer (for example, see Patent Document 1). When a water-soluble material is selected for the organic conductive layer, the configuration in which the organic conductive layer is formed on the resist layer has an advantage in that the organic conductive layer can be removed by a developer.

Further, there has been proposed a technology of forming an aluminum film or a metal conductive film on the surface of the resist layer formed on a wafer substrate (for example, see Patent Document 2).

PRIOR ART DOCUMENTS

Patent Document

Patent Document 1: JP 2014-9342 A
Patent Document 2: JP S63-288017 A

SUMMARY OF THE INVENTION

Problem to be Solved by the Invention

However, in the configuration in which the organic conductive layer is formed on the resist layer as disclosed in Patent Document 1, an electric resistance of the organic conductive layer is higher than that of the metal conductive layer, and the organic conductive layer does not have sufficient charge-eliminating performance. Further, in the configuration in which the metal conductive layer is formed on the resist layer as disclosed in Patent Document 2, the metal conductive layer is low in solubility in solvents, for example, water solubility, and hence it is difficult to remove the metal conductive layer.

Further, when the solubility of the metal conductive layer is taken into consideration, it is conceivable to use aluminum, which is soluble in an alkaline developer. However, on a surface of an aluminum thin film, an insulator layer having a depth of from about 2 nm to about 5 nm is formed by natural oxidation. Therefore, the configuration using the aluminum thin film may not have sufficient charge-eliminating performance. Further, there also arises a problem in that a surface roughness of the aluminum thin film is increased due to the natural oxidation.

In order to solve the above-mentioned problems, this invention has an object to provide a mask blank having a resist layer, which enables charge-up to be suppressed during electron beam irradiation, and to provide a method of manufacturing a mask blank having a resist layer and a method of manufacturing a transfer mask using the mask blank having a resist layer.

Means to Solve the Problem

This invention has the following configurations as means for solving the above-mentioned problems.

[Construction 1]
A mask blank having a resist layer, comprising:
a substrate having a thin film;
a resist layer formed on a surface of the thin film; and
a conductive layer formed on the resist layer,
the conductive layer including:
a first metal layer containing aluminum as a main component thereof; and
a second metal layer made of a metal other than aluminum,
the first metal layer being formed on the resist layer side of the second metal layer.

[Construction 2]
A mask blank having a resist layer according to Construction 1, wherein the second metal layer is made of a metal having an oxidation-reduction potential that is higher than an oxidation-reduction potential of aluminum.

[Construction 3]
A mask blank having a resist layer according to Construction 1 or 2, wherein the second metal layer includes at least one element selected from the group consisting of molybdenum, tungsten, titanium, and chromium.

[Construction 4]
A mask blank having a resist layer according to any one of Constructions 1 to 3,
wherein the first metal layer has a thickness in a range of from 5 nm to 15 nm,
wherein the second metal layer has a thickness in a range of from 1 nm to 5 nm, and
wherein the conductive layer has a thickness in a range of from 7 nm to 20 nm.

[Construction 5]
A mask blank having a resist layer according to any one of Constructions 1 to 4, further comprising a water-soluble resin layer formed between the conductive layer and the resist layer.

[Construction 6]

A mask blank having a resist layer according to Construction 5, wherein the water-soluble resin layer includes an organic conductive layer made of an organic conductive polymer.

[Construction 7]

A method of manufacturing a mask blank having a resist layer, the method comprising the steps of:
preparing a substrate having a thin film;
forming a resist layer on a surface of the thin film; and
forming a conductive layer on the resist layer,
the step of forming a conductive layer including the steps of:
forming a first metal layer containing aluminum as a main component thereof; and
forming a second metal layer made of a metal other than aluminum on the first metal layer.

[Construction 8]

A method of manufacturing a mask blank having a resist layer according to Construction 7, further comprising a step of, between the step of forming a resist layer and the step of forming a conductive layer, forming a water-soluble resin layer on the resist layer,
wherein the step of forming a conductive layer includes forming the conductive layer on the water-soluble resin layer.

[Construction 9]

A method of manufacturing a transfer mask using the mask blank having a resist layer of any one of Constructions 1 to 6, the method comprising a step of forming a concavo-convex pattern at least on a thin film of the mask blank having a resist layer.

Effect of the Invention

According to this invention, it is possible to provide the mask blank having a resist layer, which enables charge-up to be suppressed during electron beam irradiation, and to provide the method of manufacturing a mask blank having a resist layer and the method of manufacturing a transfer mask using the mask blank having a resist layer.

MODE FOR EMBODYING THE INVENTION

Now, an embodiment of this invention will be described in detail.

In this embodiment, description will be given in the following order.

1. Mask Blank Including Resist Layer
   (1-A) Substrate Having Thin Film
   (1-B) Resist Layer
   (1-C) Conductive Layer
   (1-D) Water-soluble Resin Layer (Organic Conductive Layer)

2. Method of Manufacturing Mask Blank Having Resist Layer
   (2-A) Step of Preparing Substrate Having Thin Film (Mask Blank)
   (2-B) Step of Forming Resist Layer
   (2-C) Step of Forming Water-soluble Resin Layer (Organic Conductive Layer)
   (2-D) Step of Forming Conductive Layer 3. Method of Manufacturing Transfer Mask For configurations not described in the following description, known configurations (for example, JP-A-2013-257593) can be adopted as appropriate. For example, regarding the specific configuration of the thin film or other films, the content of JP-A-2013-257593 can be applied.

<1. Mode of Mask Blank Having Resist Layer>

Figure 1:
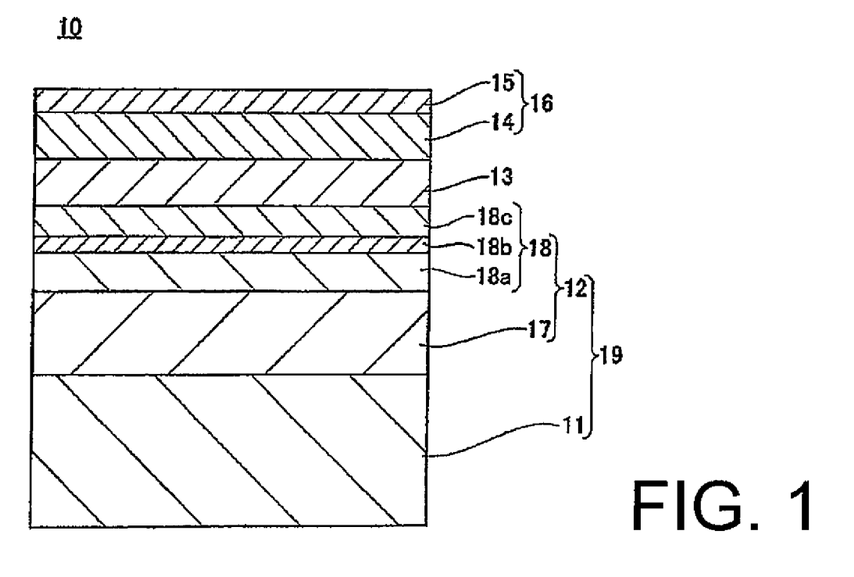
FIG. 1 is a schematic sectional view for illustrating a mask blank having a resist layer according to an embodiment of this invention.

FIG. 1 is a schematic sectional view for illustrating a mask blank 10 having a resist layer according to this embodiment. As illustrated in FIG. 1, the mask blank 10 having a resist layer has a configuration in which a thin film 12 is formed on a main surface of a substrate 11, and a resist layer 13 is formed on the thin film 12. Further, in the mask blank 10 having a resist layer, a conductive layer 16 comprising a first metal layer 14 and a second metal layer 15 is formed on the resist layer 13.

In the configuration of the mask blank having a resist layer, expressions of "on" such as "on the resist layer" and "on the first metal layer" include not only a configuration in which a target film is formed in contact with a main surface of each layer, but also a configuration in which, after another film is formed in contact with the main surface of each layer, a target film is formed on a main surface of the another film. Now, each configuration is described.

(1-A) Substrate Having Thin Film (Mask Blank)

A substrate 19 having a thin film (mask blank) comprises the substrate 11 and the thin film 12. The thin film 12 is formed on the substrate 11, and comprises a light shielding layer 18 and a semi-light-transmitting layer 17. The substrate 11 and the thin film 12 are the main components of the mask blank 19, and the thin film 12 is mainly processed so that the mask blank 19 is provided as a transfer mask.

As the substrate 11 in the mask blank 10 having a resist layer, a glass substrate may be used. In a case of a transmission mask, a glass material that has high transmittance with respect to exposure light used when a pattern is formed on a wafer is selected for the substrate 11. In a case of a reflection mask, low thermal expansion glass that can minimize thermal expansion of the substrate 11 caused by energy of exposure light is selected.

Specifically, in the case of the transmission mask (for example, binary mask, phase shift mask, and gray tone mask), examples of the material of the substrate 11 include synthetic quartz glass, soda lime glass, alumino-silicate glass, borosilicate glass, and non-alkali glass. As a detailed example, for the substrate 11 of the transfer mask that uses ArF excimer laser having a wavelength of 193 nm or KrF excimer laser having a wavelength of 254 nm as the exposure light, synthetic quartz glass having high transmittance with respect to light having a wavelength of 300 nm or less can be suitably used.

Further, in a case of an EUV mask being the reflection mask, in order to suppress distortion of a transferred pattern due to heat during exposure, $SiO_2$—$TiO_2$-based glass is suitably used for the substrate 11. $SiO_2$—$TiO_2$-based glass is a glass material having a low thermal expansion coefficient within a range of about $0\pm1.0\times10^{-7}/°$ C., more preferably, a range of about $0\pm0.3\times10^{-7}/°$ C.

Further, as illustrated in FIG. 1, the mask blank 10 having a resist layer comprises the thin film 12 on the main surface of the substrate 11. As specific configurations of the thin film 12, the following configurations (1) to (4) are given. When a first predetermined numerical value is represented by N1, a second predetermined numerical value is represented by N2, and N1<N2 is satisfied, in the following description, "N1 to N2" representing a numerical range means a range of the first predetermined numerical value N1 or more and the second predetermined numerical value N2 or less.

(1) Thin film of Binary Mask

When the mask blank 10 having a resist layer is a binary mask blank, the thin film 12 including the light shielding layer 18 is formed on the substrate 11 having permeability with respect to light having an exposure wavelength.

The light shielding layer 18 is made of a material containing a transition metal simple substance, such as chromium, tantalum, ruthenium, tungsten, titanium, hafnium, molybdenum, nickel, vanadium, zirconium, niobium, palladium, or rhodium, or a compound thereof. For example, there may be given a light shielding layer 18 made of chromium or a chromium compound obtained by adding, to chromium, at least one element selected from the group consisting of oxygen, nitrogen, and carbon. Further, for example, there may be given a light shielding layer 18 made of a tantalum compound obtained by adding, to tantalum, at least one element selected from the group consisting of oxygen, nitrogen, and boron.

Further, in the thin film 12, the structure of the light shielding layer 18 may be two-layer structure including a light shielding layer and a main surface anti-reflection layer, or may be structure having three or more layers in which a rear surface anti-reflection layer or the like is further added between the light shielding layer and the substrate 11. Further, the light shielding layer 18 may be a composition gradient film whose composition varies successively or stepwise in a film thickness direction thereof.

Further, the thin film 12 may have a configuration including an etching mask film on the light shielding layer 18. The etching mask film is preferred to be made of a material containing chromium or a chromium compound obtained by adding, to chromium, oxygen, nitrogen, carbon, or other elements, which has an etching selectivity (etching resistance) with respect to etching of the light shielding layer 18 containing transition metal silicide. At this time, the etching mask film may have an anti-reflection function so that the transfer mask can be formed under a state in which the etching mask film is left on the light shielding layer 18.

(2) Thin Film of Binary Mask Having Other Configuration

Further, as another example of the thin film 12 of the binary mask, there can be also given a configuration comprising the light shielding layer 18 made of a material containing a compound of a transition metal and silicon (transition metal silicide, particularly including molybdenum silicide).

The light shielding layer 18 is made of a material containing a compound of a transition metal and silicon. Examples of such a material include a material containing a transition metal, silicon, and oxygen and/or nitrogen as main components thereof. Further, examples of the material of the light shielding layer 18 include a material containing a transition metal, oxygen, nitrogen, and/or boron as main components thereof. As the transition metal, molybdenum, tantalum, tungsten, titanium, hafnium, nickel, vanadium, zirconium, niobium, palladium, ruthenium, rhodium, chromium, and the like may be applied.

In particular, when the light shielding layer 18 is made of a compound of molybdenum silicide, the light shielding layer 18 can have two-layer structure including a light shielding layer (for example, MoSi) and a main surface anti-reflection layer (for example, MoSiON), or three-layer structure obtained by further adding a rear surface anti-reflection layer (for example, MoSiON) between the light shielding layer and the substrate 11.

Further, the light shielding layer 18 may be a composition gradient film whose composition varies successively or stepwise in a film thickness direction thereof.

(3) Thin Film of Half Tone-Type Phase Shift Mask

When the mask blank 10 having a resist layer comprises a half tone phase shift mask, on the substrate 11 having permeability with respect to a wavelength of exposure light to be used during transfer, the thin film 12 having the semi-light-transmitting layer 17, which is made of a material containing a compound of a transition metal and silicon (transition metal silicide, particularly including molybdenum silicide), is formed.

The semi-light-transmitting layer 17 included in the thin film 12 transmits light having an intensity that substantially does not contribute to exposure (for example, 1% to 30% of exposure wavelength), and provides a predetermined phase difference (for example, 180 degrees) to the transmitted light. The half tone phase shift mask comprises a semi-light-transmitting portion, in which the semi-light-transmitting layer 17 is patterned, and a light-transmitting portion, in which the semi-light-transmitting layer 17 is not formed, and which is configured to transmit light having an intensity that substantially contributes to exposure. Then, the half tone phase shift mask is configured so that the phase of the light transmitted through the semi-light-transmitting portion has a substantially reversed relationship with the phase of the light transmitted through the light-transmitting portion. Further, the half tone phase shift mask is configured so that light beams that have passed in the vicinity of the boundary portion between the semi-light-transmitting portion and the light-transmitting portion to travel around to regions of the other portions due to the diffraction phenomenon cancel each other. In this manner, the light intensity at the boundary portion becomes substantially zero, and the contrast at the boundary portion, that is, the resolution, can be improved.

The semi-light-transmitting layer 17 is made of a material containing, for example, a compound of a transition metal and silicon (including a transition metal silicide). The material includes a material containing such a transition metal and silicon, and oxygen and/or nitrogen as main components thereof. As the transition metal, molybdenum, tantalum, tungsten, titanium, hafnium, nickel, vanadium, zirconium, niobium, palladium, ruthenium, rhodium, chromium, and the like may be applied.

When the semi-light-transmitting layer 17 has the light shielding layer 18 formed thereon. the material of the semi-light-transmitting layer 17 contains the transition metal and silicon. Thus, it is preferred that the light shielding layer 18 be made of a material having etching selectivity (resistant to etching) with respect to the semi-light-transmitting layer 17, in particular, chromium or a chromium compound in which an element such as oxygen, nitrogen, or carbon is added to chromium.

(4) Thin Film of Reflection Type Mask

When the mask blank 10 having a resist layer comprises a reflection mask, the thin film 12 has structure in which a multilayer reflective film configured to reflect exposure light is formed on the substrate 11, and an absorbent film configured to absorb exposure light is formed in a pattern on the multilayer reflective film. Light entering the reflection mask (EUV light (extreme ultraviolet ray having a wavelength of 13.5 nm)) is absorbed in a part including the absorbent film. Further, in a part not including the absorbent film, an optical image reflected by the multilayer reflective film passes through a reflection optical system to be transferred onto the semiconductor substrate.

The multilayer reflective film is formed by alternately laminating high-refractive index layers and low-refractive index layers. Examples of the multilayer reflective film include a Mo/Si periodically laminated film in which Mo films and Si films are alternately laminated for about 40 periods, a Ru/Si periodic multilayer film, a Mo/Be periodic multilayer film, a Mo compound/Si compound periodic multilayer film, a Si/Nb periodic multilayer film, a Si/Mo/Ru periodic multilayer film, a Si/Mo/Ru/Mo periodic multilayer film, and a Si/Ru/Mo/Ru periodic multilayer film. The material of the multilayer reflective film may be selected as appropriate depending on the exposure wavelength.

Further, for the absorbent film, a material having a function of absorbing, for example, EUV light being the exposure light, for example, tantalum (Ta) alone or a material having Ta as a main component thereof, may be suitably used. A crystal state of such an absorbent film is preferred to have amorphous or microcrystalline structure from the viewpoints of smoothness and flatness.

(1-B) Resist Layer

The resist layer 13 may be formed by a known method with use of a known resist composition of the related art. For example, a known positive resist, a known negative resist, and a known chemically amplified resist may be used. Further, the resist composition may contain a photosensitive resin, a photoacid generator (PAG), a basic compound, a surfactant, and an organic solvent being a solvent.

(1-C) Conductive Layer

The conductive layer 16 comprises the first metal layer 14 containing aluminum as a main component thereof and the second metal layer 15 made of a metal other than aluminum. Further, in the mask blank 10 having a resist layer, the conductive layer 16 has a configuration in which the first metal layer 14 is formed on the resist layer 13 side and the second metal layer 15 is formed on the first metal layer 14. In this manner, the first metal layer 14 containing aluminum as the main component thereof is not exposed on the surface of the mask blank 10 having a resist layer.

The conductive layer 16 is preferred to have an entire thickness of from 7 nm to 20 nm. The reason is as follows. When the thickness of the conductive layer 16 is smaller than 7 nm, it is difficult to ensure sufficient conductivity to suppress the charge-up due to electron beam irradiation. When the thickness of the conductive layer 16 is larger than 20 nm, in a step of forming a transfer mask with use of the mask blank 10 having a resist layer, a residue is likely to occur when the conductive layer 16 is removed, and may remain as a foreign matter with high possibility.

Further, the conductive layer 16 is preferred to have a sheet resistance of from 10 Ω/sq. to $1.0 \times 10^6$ Ω/sq., and is more preferred to have a sheet resistance of from 100 Ω/sq. to $1.0 \times 10^5$ Ω/sq. The sheet resistance is a value measured by a four-point probe method defined in JIS K 7194: 1994. The reason for the preferred sheet resistance is as follows. When the sheet resistance of the conductive layer 16 exceeds $1.0 \times 10^6$ Ω/sq., the charge eliminating effect becomes insufficient, and the pattern position accuracy is deteriorated. When the sheet resistance of the conductive layer 16 falls below 10 Ω/sq., electrons flowing through the conductive layer 16 may affect the resist layer, and the sensitivity may be reduced.

Further, the conductive layer 16 is preferred to have a surface roughness Ra of 2 nm or less. The roughness is a value measured by a method defined in JIS B 0601: 2001.

(First Metal Layer)

The first metal layer 14 contains aluminum as a main component thereof. The main component means a component having the highest occupied ratio in the composition. The expression above means that, in the first metal layer 14, aluminum is a component having the highest composition ratio (atomic ratio).

The first metal layer 14 is preferred to contain aluminum at an atomic composition percentage of 80 at % or more as a content (content ratio), and is more preferred to contain aluminum at an atomic composition percentage of 90 at % or more. In particular, it is preferred to form the entire first metal layer 14 of aluminum except for inevitable impurities.

Aluminum is alkali-soluble. Therefore, aluminum can be easily removed by pre-rinsing with use of pure water (deionized water) or an alkaline solution before development or with use of an alkaline developer. Therefore, the transfer mask can be formed from the mask blank without adding the step of removing the first metal layer 14.

The first metal layer 14 is preferred to have a thickness of from 5 nm to 15 nm, and is more preferred to have a thickness of from 7 nm to 10 nm. The reason is as follows. When the thickness of the first metal layer 14 is smaller than 5 nm, it is difficult to ensure sufficient conductivity to suppress the charge-up due to electron beam irradiation. When the thickness of the first metal layer 14 is larger than 15 nm, in the step of forming a transfer mask with use of the mask blank 10 having a resist layer, an aluminum residue is likely to occur when the conductive layer 16 or the first metal layer 14 is removed, and may remain as a foreign matter with high possibility.

The first metal layer 14 is preferred to have a sheet resistance of from $1.0 \times 10^6$ Ω/sq. to 5.0 Ω/sq. The reason is as follows. When the sheet resistance of the first metal layer 14 is lower than 5.0 Ω/sq., an electron expansion occurs from the electron beam irradiation position to a peripheral portion via the first metal layer 14, and hence the shape of the resist pattern may be deteriorated. Further, when the sheet resistance of the first metal layer 14 is higher than $1.0 \times 10^5$ Ω/sq., the charge eliminating effect may be reduced.

When an atomic force microscope (AFM) is used to measure a surface roughness and obtain Ra (center line surface roughness) based on height data in a 10-nm square range, the first metal layer 14 is preferred to have a surface roughness of 0.7 nm or less. The reason is as follows. When the surface roughness Ra of the first metal layer 14 exceeds 0.7 nm, the surface area of the first metal layer 14 is increased, and thus there occurs a problem in that oxidation is likely to occur at the interface between the first metal layer 14 and the second metal layer 15.

(Second Metal Layer)

The second metal layer 15 is made of a metal other than aluminum. The second metal layer 15 made of a metal other than aluminum substantially does not contain aluminum. The expression "substantially does not contain aluminum" means a configuration not containing aluminum except for inevitable impurities or a diffused part from the first metal layer 14, and specifically refers to a state in which the atomic composition percentage of aluminum is less than 1 at % as the content (content ratio). Further, as the metal other than aluminum, it is preferred to use a material from which a film can be formed under a state in which the same vacuum state is maintained from the formation of the aluminum film of the first metal layer 14. In particular, as the metal other than aluminum, it is preferred to use a material from which a film having high denseness can be formed and a film can be formed by sputtering.

When the second metal layer 15 is formed on the first metal layer 14, the first metal layer 14 is in an airtight state, and, for example, there occurs a situation in which the quality of the first metal layer 14 does not change due to oxygen or the like present in the atmosphere during storage. That is, the second metal layer 15 functions as a protective layer for the first metal layer 14. Therefore, the second metal layer 15 suppresses the oxidation of aluminum forming the first metal layer 14. Further, the second metal layer 15 substantially does not contain aluminum, and thus increase in sheet resistance due to oxidation of aluminum and increase in surface roughness can be suppressed.

Depending on the material forming the second metal layer 15, a metal oxide may be formed due to natural oxidation on the surface of the second metal layer 15. In particular, when a metal other than a noble metal is used for the second metal layer 15, an oxide film of a metal forming the second metal layer 15 is formed on the surface (that is, exposed surface) of the mask blank 10 having a resist layer. In this example, a configuration in which "an oxide film of a metal is formed" includes not only the above-mentioned configuration in which the oxide film of the metal forming the second metal layer 15 is formed on the surface of the second metal layer 15 but also a configuration in which the metal forming the second metal layer 15 is entirely oxidized.

The metal forming the second metal layer 15 is preferred to be a transition metal. The reason is as follows. Even when the transition metal is a metal having a low standard electrode potential, in natural oxidation, the oxidation number does not increase to cause the metal to become an insulator, and the conductivity is maintained. For example, a Mo(III, IV) or W(IV) oxide has a satisfactory conductivity. Therefore, when the second metal layer 15 is made of a transition metal, the conductivity is ensured even when the surface of the second metal layer 15 is oxidized, and the charge-up due to the electron beam irradiation can be suppressed.

Further, the metal forming the second metal layer 15 is preferred to have an oxidation-reduction potential that is higher than that of aluminum. The reason is as follows. When the oxidation-reduction potential of the metal forming the second metal layer 15 is higher than that of aluminum, the metal forming the second metal layer 15 is more easily oxidized than aluminum forming the first metal layer 14. Therefore, the second metal layer 15 serves as an oxidation sacrificial layer, and thus the oxidation of aluminum forming the first metal layer 14 can be suppressed.

Even when the second metal layer 15 is oxidized, as long as aluminum forming the first metal layer 14 is not oxidized, the conductivity required for the conductive layer 16 can be maintained. Specifically, aluminum forming the first metal layer 14 has a very high conductivity, and hence even when the resistance of the second metal layer 15 is higher than that of the first metal layer 14, the conductivity of the entire conductive layer 16 is secured by aluminum. Therefore, the conductivity of the conductive layer 16 can be sufficiently ensured.

Meanwhile, if aluminum forming the first metal layer 14 is oxidized, it is difficult to sufficiently ensure the conductivity of the conductive layer 16, and the sheet resistance of the first metal layer 14 is increased. Therefore, there is a disadvantage in terms of suppression of the charge-up due to the electron beam irradiation. Further, if aluminum is oxidized, the surface roughness of the first metal layer 14 is increased, and there is a disadvantage in terms of quality of the mask blank, which will be described later.

Further, the conductive layer 16 is preferred to have a layer having high smoothness on its surface. The reason is as follows. When the surface of the conductive layer 16 has a high roughness, the thickness may not be able to be measured in an inspection as the mask blank. Therefore, the conductive layer 16 is required to have smoothness to an extent that enables inspection as the mask blank.

Meanwhile, in a case of such a low-melting-point metal as the above-mentioned aluminum forming the first metal layer 14 described above, when a layer is formed, a metal grain aggregate is generated, and this grain aggregate grows. As a result, as the first metal layer 14, a layer having large irregularities may be formed on the surface. Therefore, the thickness of the conductive layer may not be able to be inspected in the mask blank in which the first metal layer 14 is formed on the surface, and hence there may arise a problem in quality as the mask blank.

Therefore, in the conductive layer 16, it is preferred to form the second metal layer 15 having high smoothness on the first metal layer 14 made of aluminum. That is, when the second metal layer 15 having high smoothness is formed on the first metal layer 14 having high roughness, occurrence of defects can be suppressed in the film thickness inspection, and thus reduction in quality of the mask blank can be suppressed.

When the surface roughness of the second metal layer 15 is defined similarly to the surface roughness of the conductive layer 16 described above, the second metal layer 15 is preferred to have a surface roughness Ra of 0.7 nm or less. In a case of a configuration in which the second metal layer 15 is formed on the surface of the conductive layer 16, the roughness of the second metal layer 15 corresponds to the roughness of the conductive layer 16.

When another layer is further formed on the second metal layer 15 in the conductive layer 16, the thickness of the conductive layer 16 depends on the surface shape of the another layer. Therefore, when another layer other than the second metal layer 15 is formed on the surface of the conductive layer 16, the second metal layer 15 may have any surface roughness. However, even in the case of this configuration, as the surface of the second metal layer 15 becomes smoother, the surface of the upper layer becomes smoother. Therefore, the second metal layer 15 is also preferred to be formed smooth.

In order to form the second metal layer 15 having high smoothness, the second metal layer 15 is preferred to be formed of a metal having a melting point that is higher than that of aluminum. The reason is as follows. During film formation by, for example, sputtering, such a high-melting-point metal is deposited on the substrate not as cluster but as finer particles. Therefore, a metal grain aggregate is less likely to be generated on the surface of the formed film, and a film having a uniform thickness in the surface direction is more likely to be formed than in the case of the first metal layer 14 made of aluminum.

In view of this, when the second metal layer 15 made of a metal having a melting point that is higher than that of aluminum is formed on the first metal layer 14 made of aluminum, the irregularities of the surface of the first metal layer 14 made of aluminum can be smoothened by the second metal layer 15 made of a high-melting-point metal. As described above, the surface of the conductive layer 16 is smoothened with use of the second metal layer 15 made of a high-melting-point metal. As a result, in the inspection of the mask blank, the measurement of the thickness of the conductive layer 16 is facilitated, and the reduction in quality of the mask blank can be suppressed.

For such a second metal layer 15, a metal material that functions as a protective layer for the first metal layer 14 containing aluminum as a main component thereof can be used without particular limitation. In particular, when film formability or the like is taken into consideration, the second metal layer 15 is preferred to contain at least one metal selected from the group of elements included in a range between Group 4 elements and Group 6 elements.

Further, from the viewpoint of the metal material from which a film can be formed by sputtering under a state in which the same vacuum state is maintained, for the second metal layer 15, it is preferred to use, for example, molybdenum, tungsten, titanium, and chromium.

Further, from the viewpoint of the metal material that has a melting point that is higher than that of aluminum, the second metal layer 15 is preferred to be made of molybdenum, tungsten, tantalum, and niobium.

In particular, when the above-mentioned film formability, oxidation prevention performance, and smoothness are taken into consideration, the second metal layer 15 is preferred to be made of molybdenum.

When the second metal layer 15 is formed with use of those materials, the oxidation of aluminum forming the first metal layer 14 can be prevented, and the smoothness of the surface of the conductive layer 16 can be enhanced.

The thickness of the second metal layer 15 is preferred to be from 1 nm to 5 nm. The reason is as follows. When the thickness of the second metal layer 15 is smaller than 1 nm, both of the suppression of oxidation of the first metal layer 14 and the smoothness of the surface of the conductive layer 16 may become insufficient. Further, when the thickness of the second metal layer 15 is larger than 5 nm, a residue of the conductive layer 16 is likely to occur when the conductive layer 16 is removed. Further, when the thickness of the conductive layer 16 is larger than 5 nm, there is a disadvantage in formation of a fine pattern of the mask blank.

On the surface of the second metal layer 15, a metal oxide is formed due to natural oxidation. However, when the second metal layer 15 is made of metals such as molybdenum, tungsten, titanium, and chromium, the oxide has conductivity, and a part other than the naturally oxidized film on the surface is maintained in a state of a metal that is not oxidized. Therefore, even when the thickness of the second metal layer 15 is equal to or smaller than 5 nm, the conductive layer 16 can maintain sufficient conductivity.

[Effect of Embodiment]

With the above-mentioned configuration of the conductive layer 16, first, the first metal layer 14 made of aluminum is formed on the resist layer 13, and the second metal layer 15 made of a metal other than aluminum is formed on the first metal layer 14. Aluminum applied to the first metal layer 14 has high conductivity, and hence the conductive layer 16 can have sufficient conductivity even when a thin second metal layer 15 is formed. For example, even when the second metal layer 15 is a layer of 5 nm or less, the conductivity of the conductive layer 16 is sufficiently ensured. Therefore, even when the second metal layer 15 is a thin layer, charges of the resist layer 13 that are generated when electron beams are radiated can be effectively eliminated. As a result, the charge-up due to the electron beam irradiation can be suppressed.

Further, a layer containing aluminum as a main component thereof is included as the first metal layer 14, and hence as compared to a case in which such an organic conductive layer as that of Patent Document 1 is used as the conductive layer for suppressing the charge-up, the conductive layer 16 in this embodiment can be formed thinner. Therefore, as compared to the case in which the organic conductive layer or the like is formed on the resist layer as in Patent Document 1, in the conductive layer 16 of this embodiment, a fine pattern can be formed more easily on the mask blank, and the conductivity can be dramatically enhanced when a pattern is drawn by electron beam irradiation.

[Modification Example of Mask Blank Having Resist Layer]

Figure 2:
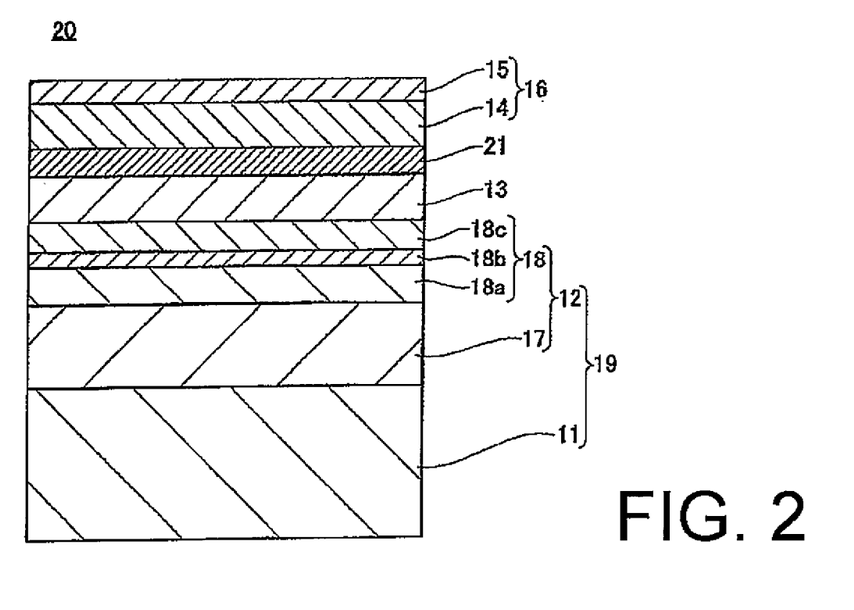
FIG. 2 is a schematic sectional view for illustrating a modification example of the mask blank having a resist layer.

Next, a modification example of a mask blank having a resist layer will be described. FIG. 2 is a schematic sectional view for illustrating the modification example of the mask blank having a resist layer. A mask blank 20 having a resist layer illustrated in FIG. 2 has a configuration in which the thin film 12 is formed on the main surface of the substrate 11, and the resist layer 13 is formed on the thin film 12. Further, in the mask blank 20 having a resist layer, a water-soluble resin layer 21 is formed on the resist layer 13, and the conductive layer 16 comprising the first metal layer 14 and the second metal layer 15 is formed on the water-soluble resin layer 21.

The mask blank 20 having a resist layer has a configuration similar to that of the above-mentioned mask blank 10 having a resist layer illustrated in FIG. 1 except for the point that the water-soluble resin layer 21 is formed. Therefore, in the following description, only the configuration related to the water-soluble resin layer 21 will be described, and detailed description of the configuration similar to that of the mask blank 10 having a resist layer illustrated in FIG. 1 is omitted.

(1-D) Water-Soluble Resin Layer (Organic Conductive Layer)

The water-soluble resin layer 21 is formed on the main surface of the resist layer 13. The water-soluble resin layer 21 is soluble in water. As a result, the removability of the conductive layer 16 formed on the water-soluble resin layer 21 can be enhanced by pre-rinsing and development with use of, for example, water or an alkaline solution.

Examples of the water-soluble resin layer 21 include polyvinyl alcohol (PVA), polyvinylpyrrolidone (PVP), a polyacrylic acid-based polymer, polyacrylamide (PAM), polyethylene oxide (PEO), and polyaniline serving as a conductive polymer.

The above-mentioned water-soluble resin layer 21 is preferred to be formed so as to cover the main surface of the resist layer 13, and is more preferred to be formed so as to cover even the side surfaces of the resist layer 13. The conductive layer 16 is similarly preferred to be formed so as to cover the main surface of the water-soluble resin layer 21 and even the side surfaces of the water-soluble resin layer 21. When the water-soluble resin layer 21 and the conductive layer 16 are formed as described above, charges can be eliminated by bringing a part other than the main surface into contact with the earth, and thus the operability is enhanced.

<2. Method of Manufacturing Mask Blank Having Resist Layer>

Figure 3:
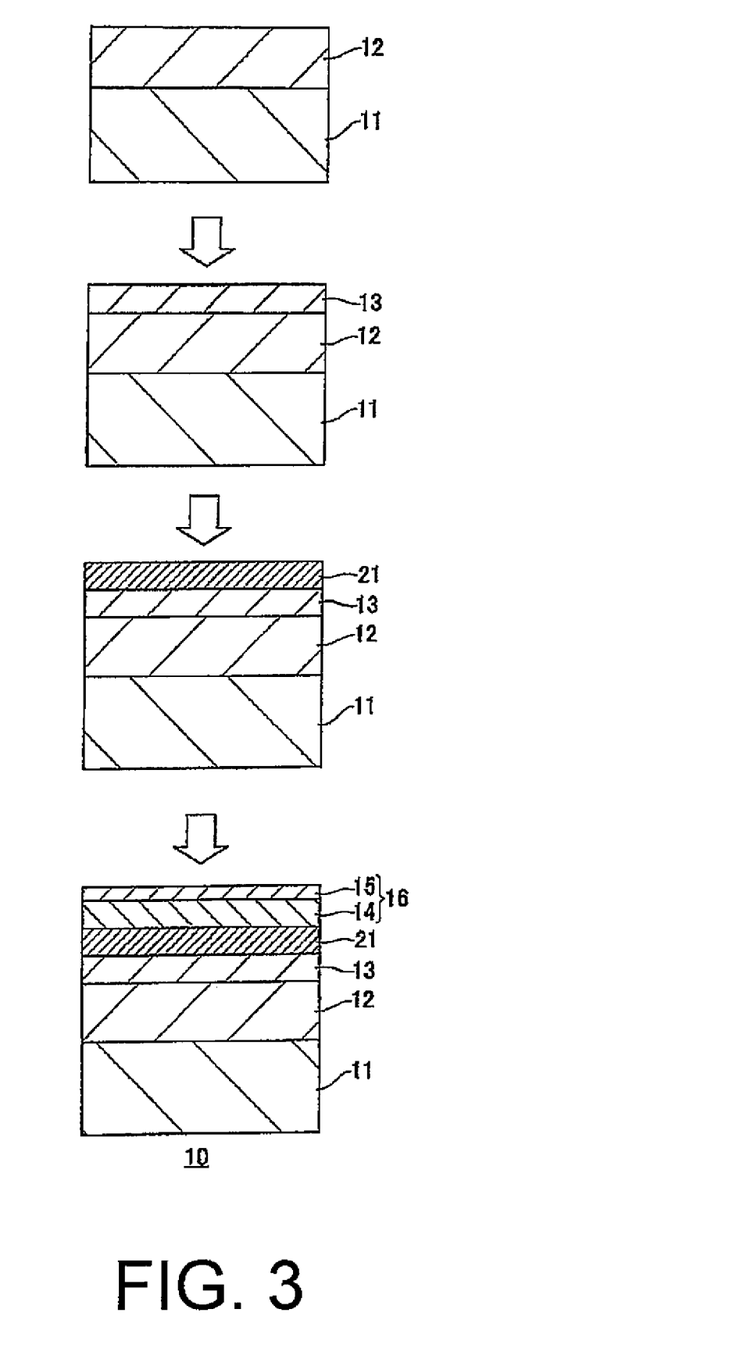
FIG. 3 is a schematic sectional view for illustrating a method of manufacturing the mask blank having a resist layer illustrated in FIG. 2.

Next, a method of manufacturing the above-mentioned mask blank having a resist layer will be described with reference to FIG. 3. FIG. 3 is a schematic sectional view for illustrating a method of manufacturing the above-mentioned mask blank 20 having a resist layer illustrated in FIG. 2. In the manufacture of the above-mentioned mask blank 10 having a resist layer with the configuration illustrated in FIG. 1, a step of forming the water-soluble resin layer 21 to be described later is not performed. The manufacture of the mask blank 10 having a resist layer with the configuration illustrated in FIG. 1 can be performed similarly to the manufacture of the mask blank 20 having a resist layer illustrated in FIG. 2 except for the step of forming the water-soluble resin layer 21.

Further, in the method of manufacturing the mask blank 20 having a resist layer described below, description is given of an example in which the substrate 11 is prepared and the thin film 12 is formed on the substrate 11, but the mask blank 19 having the thin film 12 formed on the substrate 11 in advance may be prepared, and the resist layer 13 may be formed on the prepared mask blank 19.

(2-A) Step of Preparing Substrate Having Thin Film (Mask Blank)

First, the substrate 11 made of quartz glass or the like is prepared. Next, the thin film 12 comprising the semi-light-transmitting layer 17 and the light shielding layer 18 is formed on the main surface of the substrate 11. As the specific configuration or preparation method, a known configuration or a known method can be used.

(2-B) Step of Forming Resist Layer

Next, the resist layer 13 is formed with use of positive resist liquid on the main surface of the thin film 12 formed on the substrate 11. As a specific method, a known method may be used. For example, resist liquid is applied to the main surface of the thin film 12 by spin coating, and then baking is performed. In this manner, the resist layer 13 covering the thin film 12 can be formed.

(2-C) Step of Forming Water-Soluble Resin Layer

Next, the water-soluble resin layer 21 is formed on the main surface of the resist layer 13 with use of an organic conductive polymer. As a specific method, a known method may be used. For example, water-soluble resin raw-material liquid is applied to the main surface of the resist layer 13 by spin coating. Then, rough drying is performed, and thus the water-soluble resin layer 21 is formed so as to cover the resist layer 13. In the case of the configuration in which the water-soluble resin layer 21 is not formed like the mask blank 10 having a resist layer illustrated in FIG. 1, this step of forming the water-soluble resin layer is not required to be performed.

(2-D) Step of Forming Conductive Layer

Next, the conductive layer 16 is formed on the main surface of the water-soluble resin layer 21. In the formation of the conductive layer 16, the first metal layer 14 made of aluminum is formed first, and the second metal layer 15 made of a metal other than aluminum is formed after the first metal layer 14 is formed. In this case, it is preferred to successively form the first metal layer 14 and the second metal layer 15 without performing atmosphere exposure and exposure to an oxygen gas atmosphere so that an aluminum oxide film is prevented from being formed on the surface of the first metal layer 14 during a time interval from a time instant at which the formation of the first metal layer 14 is ended to a time instant at which the formation of the second metal layer 15 is started.

The first metal layer 14 made of aluminum may be formed with use of a known method. The first metal layer 14 may be formed by, for example, sputtering, or may be formed by vacuum deposition. The second metal layer 15 made of a metal other than aluminum may be similarly formed by a known method with use of the above-mentioned metal material. The second metal layer 15 may be formed by, for example, sputtering, or may be formed by vacuum deposition. Both of the first metal layer 14 and the second metal layer 15 are preferred to be formed with use of ion beam sputtering.

The mask blank 20 having a resist layer can be formed as described above. In addition to those steps, cleaning, drying, and other steps required for the formation of the mask blank having a resist layer can also be performed as appropriate.

<3. Method of Manufacturing Transfer Mask>

A transfer mask may be formed from the mask blank having a resist layer according to the above-mentioned embodiment. The transfer mask at least comprises, in the above-mentioned mask blank, a thin film having a predetermined concavo-convex pattern.

The transfer mask may be formed by the following method.

After exposure (drawing) is performed onto the above-mentioned mask blank having a resist layer through electron beam irradiation corresponding to a predetermined pattern, a pattern forming step of forming a resist pattern through development is performed. As a specific method of charge elimination, a known method may be used in addition to the above-mentioned method. A thin film having a predetermined concavo-convex pattern is finally formed. The pattern forming step referred to here may indicate formation of a resist pattern or may indicate formation of the concavo-convex pattern directly on the thin film and the substrate. Also in this case, cleaning, drying, and other steps required for forming the transfer mask can also be performed as appropriate.

EXAMPLES

Now, with reference to FIG. 1 and FIG. 2, the embodiment of this invention will be further specifically described by way of Examples.

Example 1

With reference to FIG. 1, a method of manufacturing the mask blank 10 having a resist layer according to Example 1 of this invention will be described.

[Manufacture of Mask Blank 10 Having Resist Layer]

(Formation of Substrate Having Thin Film)

First, as the light-transmissive substrate 11, a synthetic quartz glass substrate having a size of 6-inch square and a thickness of 0.25 inch was prepared.

Next, on the prepared light-transmissive substrate 11, the semi-light-transmitting layer 17 was formed by the following method. The semi-light-transmitting layer 17 was formed with use of a single-wafer sputtering apparatus by reactive sputtering (DC sputtering) at a gas pressure of 0.3 Pa and power of a DC power source of 3.0 kW with use of a mixture target of molybdenum (Mo) and silicon (Si) (Mo:Si=10 mol %:90 mol %) and a sputtering gas containing a mixture gas of argon (Ar), nitrogen ($N_2$), and helium (He) (gas flow rate ratio of Ar:$N_2$:He=5:49:46). In this manner, a MoSiN film made of molybdenum, silicon, and nitrogen was formed to have a film thickness of 69 nm.

Further, with use of a heating furnace, the substrate having the above-mentioned MoSiN film formed thereon was subjected to heating with a heating temperature of 450° C. and a heating time of 1 hour in the atmosphere to form the semi-light-transmitting layer 17. The MoSiN film had a transmittance of 6.16% and a phase difference of 184.4 degrees with respect to an ArF excimer laser.

Next, on the above-mentioned semi-light-transmitting layer 7, the light shielding layer 18 was formed by the following method.

First, reactive sputtering (DC sputtering) was performed at a gas pressure of 0.2 Pa and power of the DC power source of 1.7 kW with use of a sputtering target of chromium (Cr) and a sputtering gas containing a mixture gas of argon (Ar), carbon dioxide ($CO_2$), nitrogen ($N_2$), and helium (He) (gas flow rate ratio of Ar:$CO_2$:$N_2$:He=20:35:10:30). In this manner, a CrOCN film 18a having a film thickness of 30 nm was formed.

Further, reactive sputtering (DC sputtering) was performed at a gas pressure of 0.1 Pa and power of the DC power source of 1.7 kW with use of, as a sputtering gas, a mixture gas atmosphere of argon (Ar) and nitrogen ($N_2$) (gas flow rate ratio of Ar:$N_2$=25:5). In this manner, a CrN film 18b having a film thickness of 4 nm was formed.

Finally, reactive sputtering (DC sputtering) was performed at a gas pressure of 0.2 Pa and power of the DC power source of 1.7 kW with use of, as a sputtering gas, a mixture gas of argon (Ar), carbon dioxide ($CO_2$), nitrogen ($N_2$), and helium (He) (gas flow rate ratio of Ar:$CO_2$:$N_2$:He=20:35:5:30). In this manner, a CrOCN film 18c having a film thickness of 14 nm was formed.

With the above-mentioned steps, the chromium-based light shielding layer 18 having three-layer lamination structure and a total film thickness of 48 nm was formed. When the optical density obtained when the semi-light-transmitting layer 17 and the light shielding layer 18 were added was 3.0 ($\lambda$=193 nm), a surface reflectance of the light shielding layer with respect to the wavelength ($\lambda$=193 nm) of the exposure light was 20%.

(Formation of Resist Layer)

On the surface of the thin film 12 formed by the above-mentioned method, a chemically amplified positive resist (PRL009S produced by FUJIFILM Electronic Materials Co., Ltd.) was applied by spin-coating, and baking (pre-baking) was performed at 140° C. for 600 seconds to form the resist layer 13 having a film thickness of 120 nm.

(Formation of Conductive Layer)

On the resist layer 13 obtained after baking (pre-baking), the first metal layer 14 made of aluminum was formed to have a thickness of 7 nm by ion beam sputtering using an aluminum target.

Further, on the first metal layer 14, the second metal layer 15 made of molybdenum was formed to have a thickness of 3 nm by ion beam sputtering using a molybdenum target.

With the above-mentioned steps, the conductive layer 16 comprising the first metal layer 14 and the second metal layer 15 and having a surface sheet resistance of about $50 \times 10^2$ $\Omega$/sq. was formed.

Further, with the above-mentioned steps, the mask blank 10 having a resist layer according to Example 1, which comprises the resist layer 13 and the conductive layer 16 on the substrate 19 having a thin film, was formed.

Example 2

With reference to FIG. 2, a method of manufacturing the mask blank 20 having a resist layer according to Example 2 of this invention will be described.

[Manufacture of Mask Blank 20 Having Resist Layer]

With a method similar to that of Example 1 described above, the substrate 19 having a thin film and the resist layer 13 were formed, and then the water-soluble resin layer 21 was formed by the following method. Further, except that the thickness of the first metal layer 14 formed of aluminum on the water-soluble resin layer 21 was set to 6 nm, the conductive layer 16 was formed by a method similar to that of Example 1 described above. With the above-mentioned steps, the mask blank 20 having a resist layer according to Example 2, which comprises the resist layer 13, the water-soluble resin layer 21, and the conductive layer 16 on the substrate 19 having a thin film, was formed.

(Formation of Water-Soluble Resin Layer)

On the resist layer 13 obtained after baking (pre-baking), a polyaniline-based organic conductive resin film (aqua-SAVE produced by Mitsubishi Rayon Co., Ltd.) was applied by spin coating, and rough drying was performed at 70° C. Thus, the water-soluble resin layer 21 being made of an organic conductive resin and having a sheet resistance of about $10 \times 10^8$ $\Omega$/sq. and a film thickness of 10 nm was formed.

Comparative Example 1

[Manufacture of Mask Blank]

After the substrate having a thin film, the resist layer, and the water-soluble resin layer were formed by a method similar to that of Example 2 described above, the conductive layer comprising only the first metal layer was formed by the following method to form a mask blank according to Comparative Example 1.

(Formation of Conductive Layer)

On the water-soluble resin layer obtained after the rough drying, a first metal layer made of aluminum was formed to have a thickness of 10 nm by ion beam sputtering using an aluminum target, and thus the conductive layer comprising only the first metal layer was formed.

<Evaluation>

A pattern was drawn with use of an electron beam drawing apparatus of ELIONIX INC. onto the resist layer 13 of the mask blank having a resist layer according to each of Example 1, Example 2, and Comparative Example 1. The pattern was exposed so that a width (half pitch) of a protruded portion (line) of the resist pattern had each value in a range of from 30 nm to 90 nm, and the ratio between the line and a space was 1:1. After the drawing, baking (post-baking) was performed at 110° C. for 600 seconds.

After that, in Example 1 and Example 2, pre-rinsing was performed to remove the conductive layer 16 with use of pure water (deionized water) or an alkaline solution. Development was subsequently performed. The development was performed by supplying a developer (THAM:tetramethyl-ammonium hydroxide) at 5 mL/sec to the substrate.

After that, dry rotation was performed for 60 seconds at high speed to achieve natural drying. The steps following the removal of the resist pattern were not performed.

The obtained resist pattern was observed by an electron microscope. In Example 1 and Example 2, a pattern was able to be satisfactorily formed at a predetermined position at half pitches of all sizes. As a result, it was understood that, in Example 1 and Example 2, charging at the time of resist pattern formation was promptly solved.

Meanwhile, in Comparative Example 1, there occurred such a phenomenon that the position of the actually formed pattern was shifted from a predetermined position at which the pattern was to be drawn when the half pitch was smaller than 70 nm. Further, when the surface state of the conductive layer was observed, an aluminum oxide layer was formed on the surface, and the surface roughness was increased.

As a result, in a case of a configuration in which an aluminum layer is exposed on the surface of the mask blank, the charging during the electron beam drawing cannot be solved due to the oxidation of aluminum, and the patterning with use of electron beam drawing cannot be applied.

This invention is not limited to the configurations of the above-mentioned embodiments and Examples, and various modifications can be made thereto without departing from the configurations of this invention.

This application is based upon and claims the benefit of priority from Japanese Patent Application No. 2015-225952, filed on Nov. 18, 2015, the disclosure of which is incorporated herein in its entirety by reference.

REFERENCE SIGNS LIST

10 mask blank having a resist layer, 11 substrate, 12 thin film, 13 resist layer, 14 first metal layer, 15 second metal layer, 16 conductive layer, 17 semi-light-transmitting layer, 18 light shielding layer, 19 mask blank, 20 mask blank having a resist layer, 21 water-soluble resin layer

The invention claimed is:

1. A mask blank having a resist layer, comprising:
a substrate having a thin film;
a resist layer formed on a surface of the thin film; and
a conductive layer formed on the resist layer,
wherein the conductive layer comprises:
   a first metal layer containing aluminum as a main component thereof; and
   a second metal layer made of a metal other than aluminum,
wherein the first metal layer is formed on the resist layer side of the second metal layer.

2. The mask blank according to claim 1, wherein the second metal layer is made of a metal having an oxidation-reduction potential that is higher than an oxidation-reduction potential of aluminum.

3. The mask blank according to claim 1, wherein the second metal layer includes at least one element selected from the group consisting of molybdenum, tungsten, titanium, and chromium.

4. The mask blank according to claim 1,
wherein the first metal layer has a thickness in a range of from 5 nm to 15 nm,
wherein the second metal layer has a thickness in a range of from 1 nm to 5 nm, and
wherein the conductive layer has a thickness in a range of from 7 nm to 20 nm.

5. The mask blank according to claim 1, further comprising a water-soluble resin layer formed between the conductive layer and the resist layer.

6. The mask blank according to claim 5, wherein the water-soluble resin layer comprises an organic conductive layer made of an organic conductive polymer.

7. A method of manufacturing a mask blank having a resist layer, the method comprising the steps of:
preparing a substrate having a thin film;
forming a resist layer on a surface of the thin film; and
forming a conductive layer on the resist layer,
wherein the step of forming a conductive layer includes the steps of:
   forming a first metal layer containing aluminum as a main component thereof; and
   forming a second metal layer made of a metal other than aluminum on the first metal layer.

8. The method according to claim 7, further comprising a step of, between the step of forming a resist layer and the step of forming a conductive layer, forming a water-soluble resin layer on the resist layer,
wherein the step of forming a conductive layer includes forming the conductive layer on the water-soluble resin layer.

9. A method of manufacturing a transfer mask using the mask blank of claim 1, the method comprising a step of forming a concavo-convex pattern at least on a thin film of the mask blank having a resist layer.

* * * * *